United States Patent
Liu et al.

(10) Patent No.: US 10,177,663 B2
(45) Date of Patent: Jan. 8, 2019

(54) DC-DC CONVERTING CIRCUIT AND MULTI-PHASE POWER CONTROLLER THEREOF

(71) Applicant: uPI semiconductor corporation, Zhubei, Hsinchu County (TW)

(72) Inventors: Hsien-Cheng Liu, Zhubei (TW); Zhao-Wai Liu, Zhubei (TW); Liang-Yi Chen, Zhubei (TW)

(73) Assignee: UPI SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 15/987,999

(22) Filed: May 24, 2018

(65) Prior Publication Data

US 2018/0351459 A1    Dec. 6, 2018

(30) Foreign Application Priority Data

Jun. 2, 2017  (TW) ............................. 106118348 A

(51) Int. Cl.
*H02M 3/158* (2006.01)
*H03K 7/08* (2006.01)
*H03K 4/48* (2006.01)
*H03K 5/00* (2006.01)
*H02M 1/00* (2006.01)

(52) U.S. Cl.
CPC ............ *H02M 3/1584* (2013.01); *H03K 4/48* (2013.01); *H03K 5/00006* (2013.01); *H03K 7/08* (2013.01); *H02M 2001/0009* (2013.01)

(58) Field of Classification Search
None
See application file for complete search history.

(56) References Cited

U.S. PATENT DOCUMENTS

| | | | |
|---|---|---|---|
| 2008/0298093 A1* | 12/2008 | Jin ........................ | H02M 3/285 363/21.06 |
| 2013/0088899 A1* | 4/2013 | Iwata ...................... | H02M 7/08 363/70 |
| 2014/0176097 A1* | 6/2014 | Huang ...................... | G05F 1/59 323/272 |
| 2014/0340949 A1* | 11/2014 | Chen ................... | H02M 1/4225 363/44 |
| 2015/0103564 A1* | 4/2015 | Duan .................... | H02M 3/285 363/21.02 |

* cited by examiner

*Primary Examiner* — Jeffrey A Gblende
(74) *Attorney, Agent, or Firm* — McClure, Qualey & Rodack, LLP

(57) ABSTRACT

A multi-phase power controller coupled to resonant power converting circuits providing an output voltage is disclosed. The multi-phase power controller includes a current sensing unit, a frequency adjusting circuit and a duty cycle adjusting circuit. The current sensing unit, coupled to a first resonant power converting circuit, provides a first sensing current. The frequency adjusting circuit includes an error amplifier and a first ramp signal generation circuit. The error amplifier provides an error signal according to the output voltage and a reference voltage. The first ramp signal generation circuit provides a first ramp signal according to the error signal. The duty cycle adjusting circuit provides a first PWM signal to the first resonant power converting circuit according to a default voltage and the first ramp signal. The change of the duty cycle of the first PWM signal is related to the first sensing current, the default voltage and the first ramp signal.

20 Claims, 9 Drawing Sheets

DC-DC CONVERTING CIRCUIT AND MULTI-PHASE POWER CONTROLLER THEREOF

BACKGROUND OF THE INVENTION

1. Field of the Invention

The invention relates to resonant power converting circuits; in particular, to a DC-DC converting circuit and a multi-phase power controller used for controlling the resonant power converting circuits.

2. Description of the Prior Art

In general, in the field of network equipment or automotive electronics, power converters are usually used to convert high voltages to low voltages. For example, FIG. 1 illustrates a schematic diagram of a conventional multi-phase resonant power converting circuit. When the output load $R_{load}$ of the conventional multi-phase resonant power converting circuit fluctuates, its multi-phase power controller usually outputs a pulse width modulation signal with a fixed duty cycle to the resonant power converting circuit and changes switching frequency according to a voltage feedback signal related to the output voltage Vo to achieve the linear voltage regulation function.

However, in practical applications, when each phase resonant power converting circuit in a conventional multi-phase resonant power converting circuit has a different parasitic inductance capacitance, even at the same frequency, each phase resonant power converting circuit will have different voltage gains, resulting in a reduction of the overall system performance, and due to the lack of current balance control mechanism of the conventional multi-phase resonant power converting circuit, it is difficult to effectively improve the current efficiency in parallel connection.

SUMMARY OF THE INVENTION

Therefore, the invention provides a DC-DC converting circuit and a multi-phase power controller thereof to overcome the above-mentioned problems in the prior art.

An embodiment of the invention is a multi-phase power controller. In this embodiment, the multi-phase power controller is coupled to resonant power converting circuits providing an output voltage. The multi-phase power controller includes a current sensing unit, a frequency adjusting circuit and a duty cycle adjusting circuit. The current sensing unit, coupled to a first resonant power converting circuit, provides a first sensing current. The frequency adjusting circuit includes an error amplifier and a first ramp signal generation circuit. The error amplifier provides an error signal according to the output voltage and a reference voltage. The first ramp signal generation circuit provides a first ramp signal according to the error signal. The duty cycle adjusting circuit provides a first PWM signal to the first resonant power converting circuit according to a default voltage and the first ramp signal. The duty cycle change of the first PWM signal is related to the first sensing current, the default voltage and the first ramp signal.

In an embodiment, the first ramp signal generation circuit includes a first current source providing a first current related to the error signal.

In an embodiment, the first sensing current and the first current are combined to adjust an amplitude of the first ramp signal.

In an embodiment, the duty cycle adjusting circuit includes a comparator. A first terminal of the comparator receives the default voltage and a second terminal of the comparator receives the first ramp signal.

In an embodiment, the duty cycle adjusting circuit includes a comparator. A first terminal of the comparator receives the default voltage through a first resistor and the first terminal of the comparator also receives the first sensing current and a second terminal of the comparator receives the first ramp signal.

In an embodiment, the multi-phase power controller further includes a second current sensing unit and a second ramp signal generation circuit. The second current sensing unit is coupled to a second resonant power converting circuit of the resonant power converting circuits and used for providing a second sensing current. The second ramp signal generation circuit is coupled to the error amplifier and used for providing a second ramp signal according to the error signal. The duty cycle adjusting circuit provides a second pulse-width modulation signal to the second resonant power converting circuit according to the default voltage and the second ramp signal. The second ramp signal generation circuit receives the first current and the first current and the second sensing current are combined to adjust an amplitude of the second ramp signal.

In an embodiment, the multi-phase power controller further includes a second current sensing unit. The second current sensing unit is coupled to a second resonant power converting circuit of the resonant power converting circuits and used for providing a second sensing current. The duty cycle adjusting circuit includes a comparator. A first terminal of the comparator receives the default voltage through a first resistor and the first terminal of the comparator also receives the second sensing current and a second terminal of the comparator receives the first ramp signal.

In an embodiment, the first resonant power converting circuit includes a converting unit, a first switch, a second switch, an input inductor, an input capacitor, a third switch and a fourth switch. The converting unit has a first terminal, a second terminal, a third terminal and a fourth terminal. The first terminal and the second terminal are located at a primary side and the third terminal and the fourth terminal are located at a secondary side. The second switch is coupled in series with the first switch between an input voltage and a ground terminal. The input inductor has a terminal coupled between the first switch and the second switch. The input capacitor is coupled in series with the input inductor between another terminal of the input inductor and the first terminal of the converting unit. The third switch and the fourth switch are coupled between the third terminal of the converting unit and the ground terminal and between the fourth terminal of the converting unit and the ground terminal respectively.

In an embodiment, the first resonant power converting circuit includes a converting unit, a first switch, a second switch, a first input capacitor, a second input capacitor, an input inductor, a third switch and a fourth switch. The converting unit has a first terminal, a second terminal, a third terminal and a fourth terminal. The first terminal and the second terminal are located at a primary side and the third terminal and the fourth terminal are located at a secondary side. The second switch is coupled in series with the first switch between an input voltage and a ground terminal. The second terminal of the converting unit is coupled between the first switch and the second switch. The second input capacitor is coupled in series with the first input capacitor between the input voltage and the ground terminal. The input inductor has a terminal coupled between the first input capacitor and the second input capacitor and another terminal coupled to the first terminal of the converting unit. The third switch and the fourth switch are coupled between the third terminal of the converting unit and the ground terminal and between the fourth terminal of the converting unit and the ground terminal respectively.

In an embodiment, the first resonant power converting circuit includes a converting unit, a first switch, a second switch, an input inductor, an input capacitor, a third switch and a fourth switch. The converting unit has a first terminal, a second terminal, a third terminal, a fourth terminal and a fifth terminal. The first terminal and the second terminal are located at a primary side; the third terminal, the fourth terminal and the fifth terminal are located at a secondary side. The fifth terminal is coupled to a ground terminal. The second switch is coupled in series with the first switch between an input voltage and the ground terminal. The input inductor has a terminal coupled between the first switch and the second switch and another terminal coupled to the first terminal of the converting unit. The input capacitor has a terminal coupled to the second terminal of the converting unit and another terminal coupled to a second resonant power converting circuit of the resonant power converting circuits. The third switch is coupled between the third terminal of the converting unit and the output voltage. The fourth switch is coupled between the fourth terminal of the converting unit and the output voltage.

Another embodiment of the invention is a DC-DC converting circuit. In this embodiment, the DC-DC converting circuit includes a plurality of resonant power converting circuits and a multi-phase power controller. The resonant power converting circuits is used for providing an output voltage. Each resonant power converting circuit includes an input inductor and a converting unit, the input inductor is coupled to a primary side of the converting unit. The multi-phase power controller is coupled to the resonant power converting circuits and used for obtaining a first sensing current from a first resonant power converting circuit of the resonant power converting circuits. The multi-phase power controller generates an error signal according to the output voltage and a reference voltage and then generates a first ramp signal according to the error signal. The multi-phase power controller adjusts a duty cycle of a first pulse-width modulation signal outputted to the first resonant power converting circuit by the multi-phase power controller according to a default voltage, the first sensing current and the first ramp signal.

Compared to the prior arts, the DC-DC converting circuit disclosed in the invention can control the resonant power converting circuits to convert the input voltage into the output voltage through its multi-phase power controller, not only the duty cycle of the PWM signal can be adjusted according to the current feedback signal sensed from the resonant power converting circuits to fine-tune the output voltage to achieve current balance, but also the switching frequency can be adjusted according to the output voltage feedback signal from the resonant power converting circuits to rough-tune the output voltage to achieve the linear voltage regulation effect. Therefore, the multi-phase power controller disclosed in the invention can not only reduce the switching loss of the primary side switches of the resonant power converting circuits, but also improve the overall performance of the system by the current balance mechanism.

The advantage and spirit of the invention may be understood by the following detailed descriptions together with the appended drawings.

BRIEF DESCRIPTION OF THE APPENDED DRAWINGS

Figure 7A:
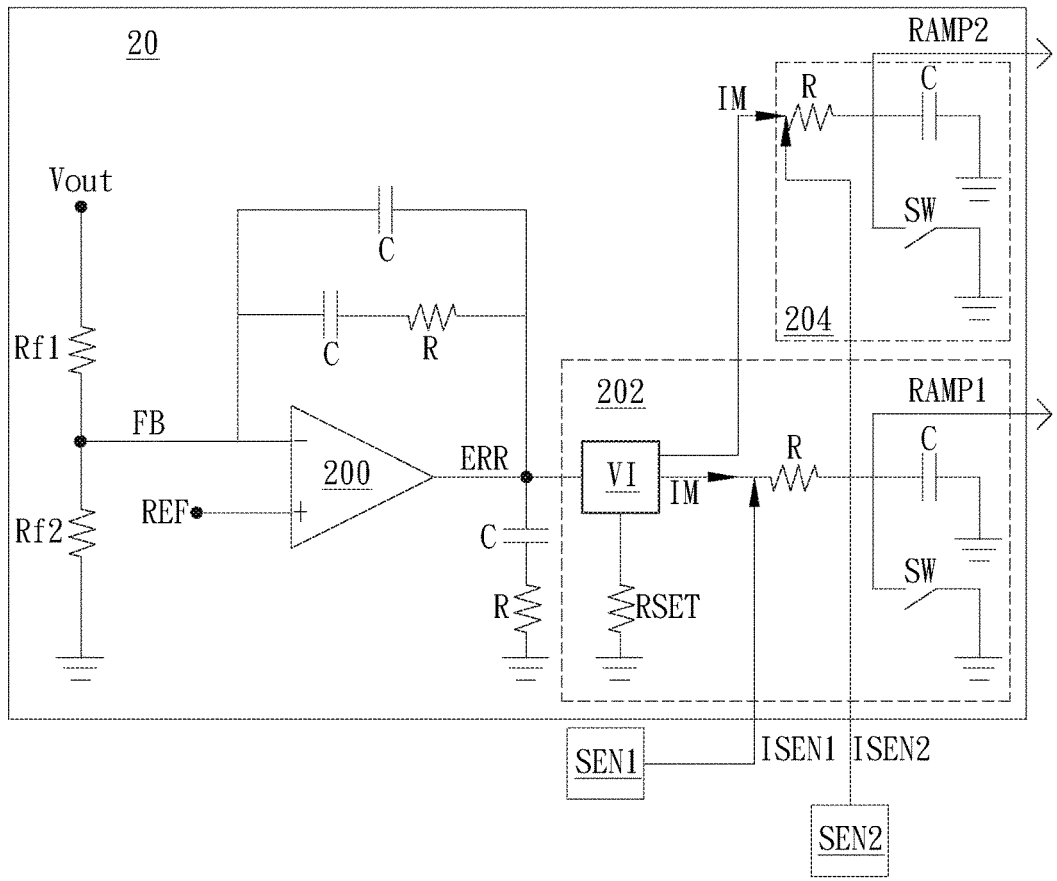
Figure 7B:
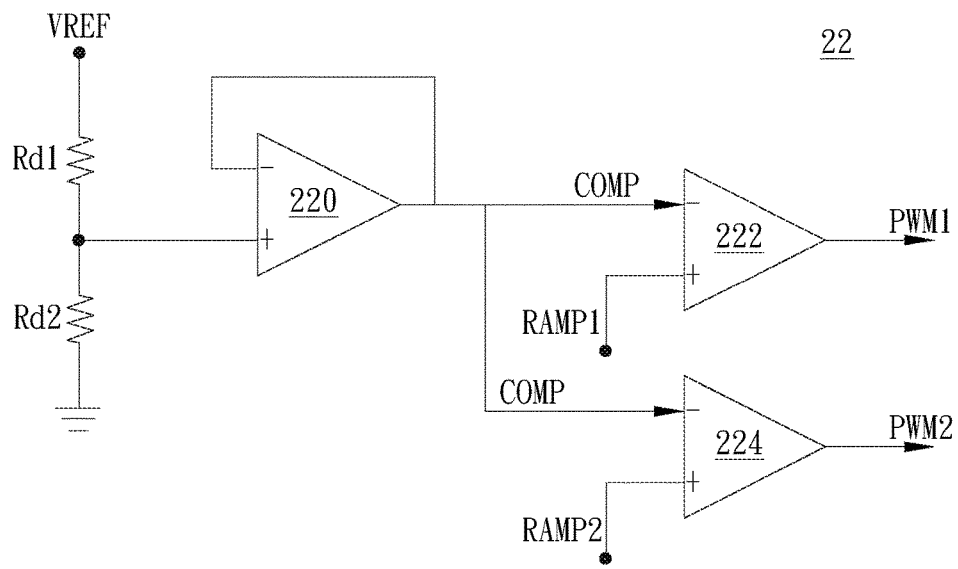
Figure 7C:
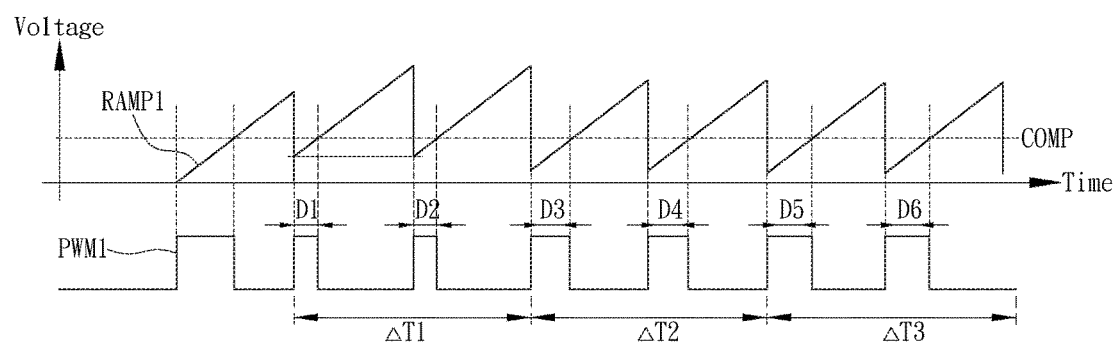

FIG. 7A~FIG. 7C illustrate schematic diagrams of the frequency adjusting circuit 20 and the duty cycle adjusting circuit 22 and a timing diagram of the duty cycle of the first pulse width modulation signal PWM1 adjusted by changing the first ramp signal RAMP1 in an embodiment.

Figure 8A:
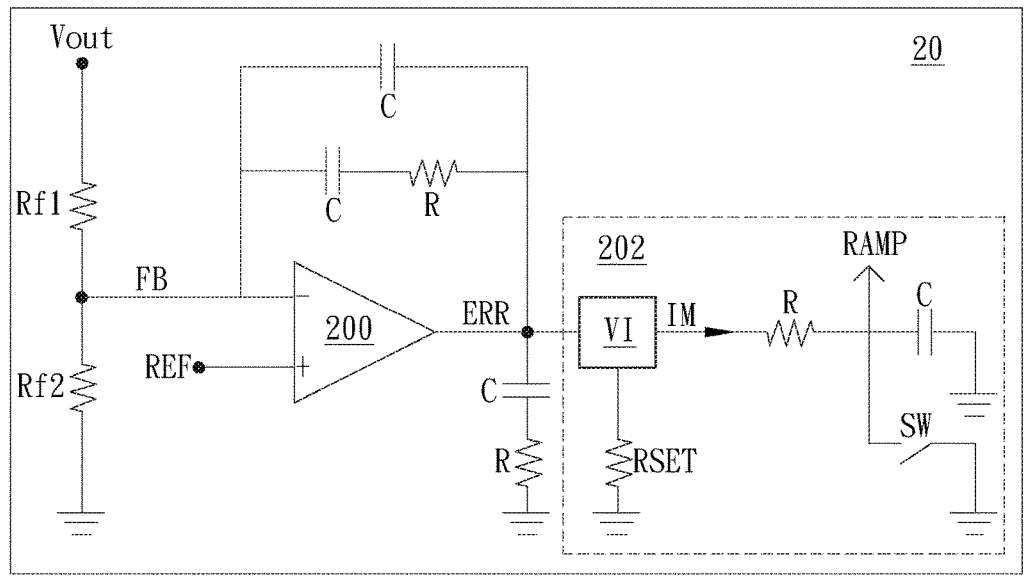
Figure 8B:
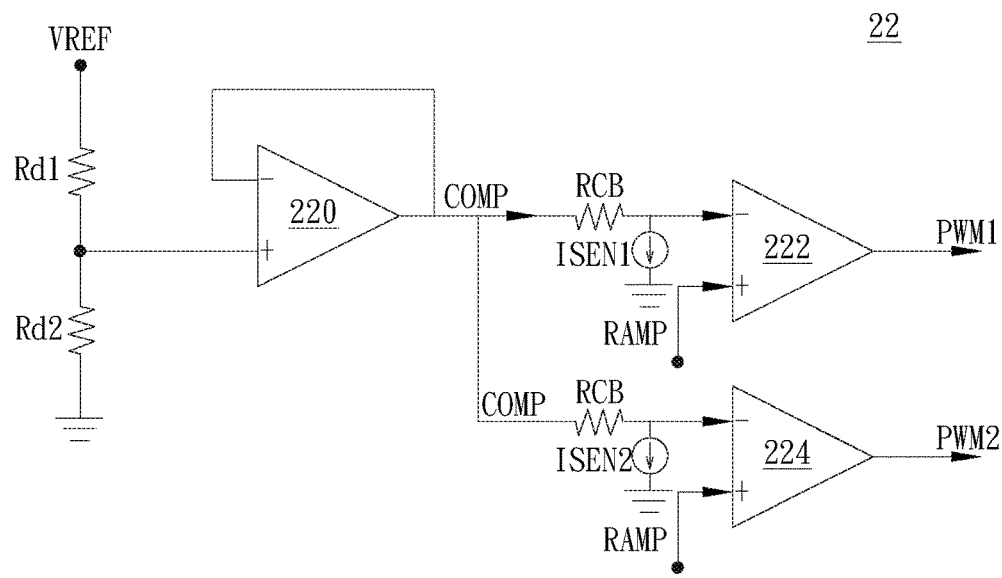
Figure 8C:
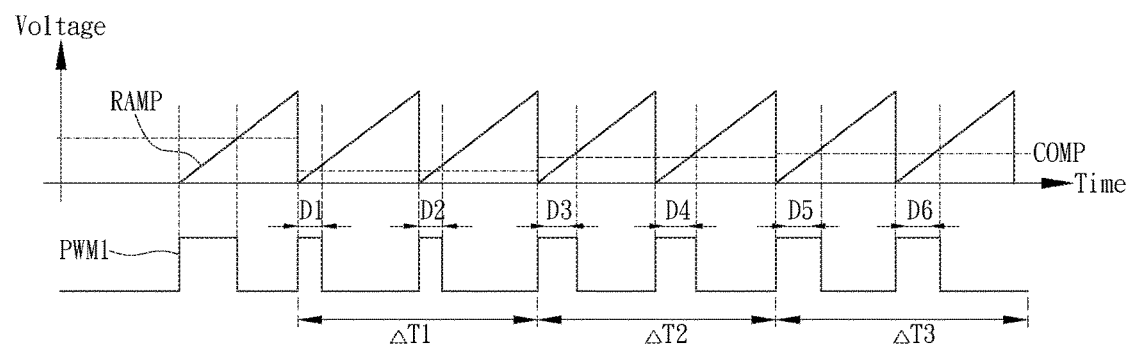

FIG. 8A~FIG. 8C illustrate schematic diagrams of the frequency adjusting circuit 20 and the duty cycle adjusting circuit 22 and a timing diagram of the duty cycle of the first pulse width modulation signal PWM1 adjusted by changing the default voltage COMP in another embodiment.

DETAILED DESCRIPTION OF THE INVENTION

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts.

A preferred embodiment of the invention is a multi-phase power controller. In this embodiment, the multi-phase power controller can be used in a power converting apparatus (e.g., a DC-DC power converter). The multi-phase power controller can be coupled to resonant power converting circuits respectively and provide the pulse-width modulation signal to each resonant power converting circuit respectively to control the operation of each resonant power converting circuit to provide a function of converting the input voltage (Vin) into the output voltage (Vout).

For example, the power converting apparatus can convert an input voltage (Vin) of 48V into an output voltage (Vout) of 0.6~1.5V. In an embodiment, the power converting apparatus can make the output voltage (Vout) less than 4% of the input voltage (Vin), but not limited to this. In another embodiment, the power converting apparatus can convert an input voltage (Vin) of 48V into an output voltage (Vout) of 3.3V or 5V. In still another embodiment, the power converting apparatus can convert an input voltage (Vin) of 48V into an output voltage (Vout) of 12V.

Figure 1:
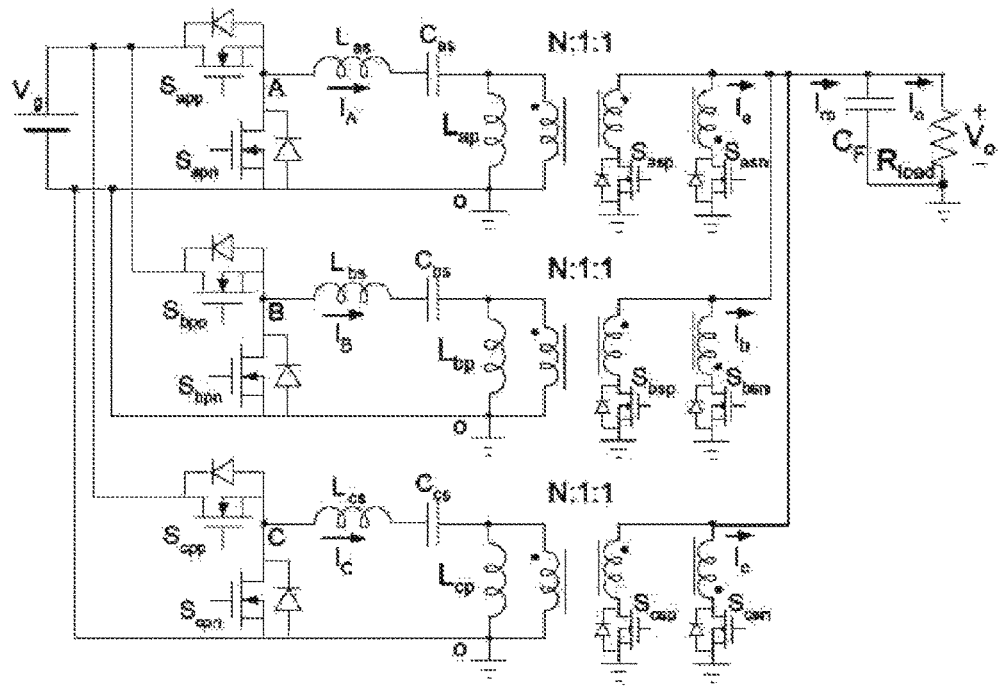
FIG. 1 illustrates a schematic diagram of the conventional multi-phase resonant power converting circuit.
Figure 2:
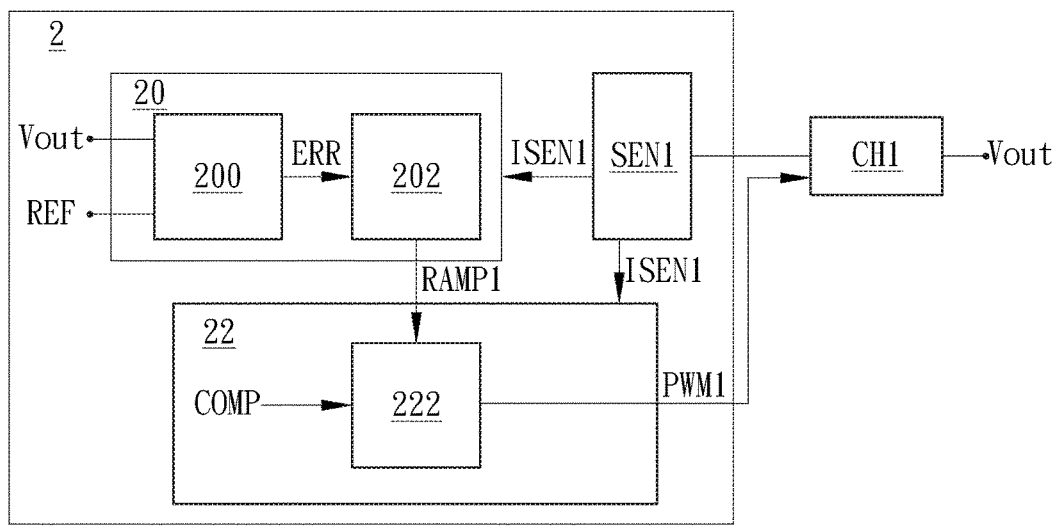
FIG. 2 illustrates a schematic diagram of the multi-phase power controller coupled to the resonant power converting circuits in an embodiment of the invention.

Please refer to FIG. 2. FIG. 2 illustrates a functional block diagram of the multi-phase power controller in this embodiment. As shown in FIG. 2, the multi-phase power controller 2 is coupled to resonant power converting circuits including a first resonant power converting circuit CH1. The first resonant power converting circuit CH1 is used to provide the output voltage Vout.

The multi-phase power controller 2 includes a first current sensing unit SEN1, a frequency adjusting circuit 20 and a duty cycle adjusting circuit 22. The frequency adjusting circuit 20 is coupled to the duty cycle adjusting circuit 22. The duty cycle adjusting circuit 22 is coupled to the first resonant power converting circuit CH1. The first current sensing unit SEN1 is coupled to the first resonant power converting circuit CH1 and performs sensing on the first resonant power converting circuit CH1 to obtain a first sensing current ISEN1. In practical applications, the first current sensing unit SEN1 can be coupled to the first resonant power converting circuit CH1 through at least one current sensing element (e.g., a sensing resistor or a DCR sensing circuit) to perform sensing. In addition, the first current sensing unit SEN1 can be coupled to the frequency adjusting circuit 20 and/or the duty cycle adjusting circuit 22 and used for providing the first sensing current ISEN1 to the frequency adjusting circuit 20 and/or the duty cycle adjusting circuit 22.

The frequency adjusting circuit 20 includes an error amplifier 200 and a first ramp signal generation circuit 202. The error amplifier 200 is coupled to the first ramp signal generation circuit 202. The error amplifier 200 receives the output voltage Vout (or a feedback voltage related to the output voltage Vout) and a reference voltage REF respectively and provides an error signal ERR to the first ramp signal generation circuit 202 according to the output voltage Vout (or a feedback voltage related to the output voltage Vout) and the reference voltage REF.

The first ramp signal generation circuit 202 generates a first ramp signal RAMP1 to the duty cycle adjusting circuit 22 according to the error signal ERR. In fact, the first ramp signal generation circuit 202 can further receive the first sensing current ISEN1 provided by the first current sensing unit SEN1 and then generates the first ramp signal RAMP1 to the duty cycle adjusting circuit 22 according to the error signal ERR and the first sensing current ISEN1.

The duty cycle adjusting circuit 22 includes a comparator 222. The comparator 222 receives the first ramp signal RAMP1 from the first ramp signal generation circuit 202 and a default voltage COMP respectively and then generates a first pulse width modulation signal PWM1 to the first resonant power converting circuit CH1 according to the default voltage COMP and the first ramp signal RAMP1 to control the operation of the first resonant power converting circuit CH1. In fact, the default voltage COMP can be generated by the duty cycle adjusting circuit 22 according to a reference voltage or the duty cycle adjusting circuit 22 can receive the default voltage COMP from outside, and there is no specific limit.

In addition, the duty cycle adjusting circuit 22 can further receive the first sensing current ISEN1 provided by the first current sensing unit SEN1 and then generate the first pulse width modulation signal PWM1 to the first resonant power converting circuit CH1 according to the default voltage COMP, the first ramp signal RAMP1 and the first sensing current ISEN1 to control the operation of the first resonant power converting circuit CH1.

It should be noticed that as to the control the operation of the first resonant power converting circuit CH1 provided to the first resonant power converting circuit CH1 by the duty cycle adjusting circuit 22 of the multi-phase power controller 2, the duty cycle change of the first pulse width modulation signal PWM1 will be related to the first sensing current ISEN1, the default voltage COMP and the first ramp signal RAMP1.

Figure 3A:
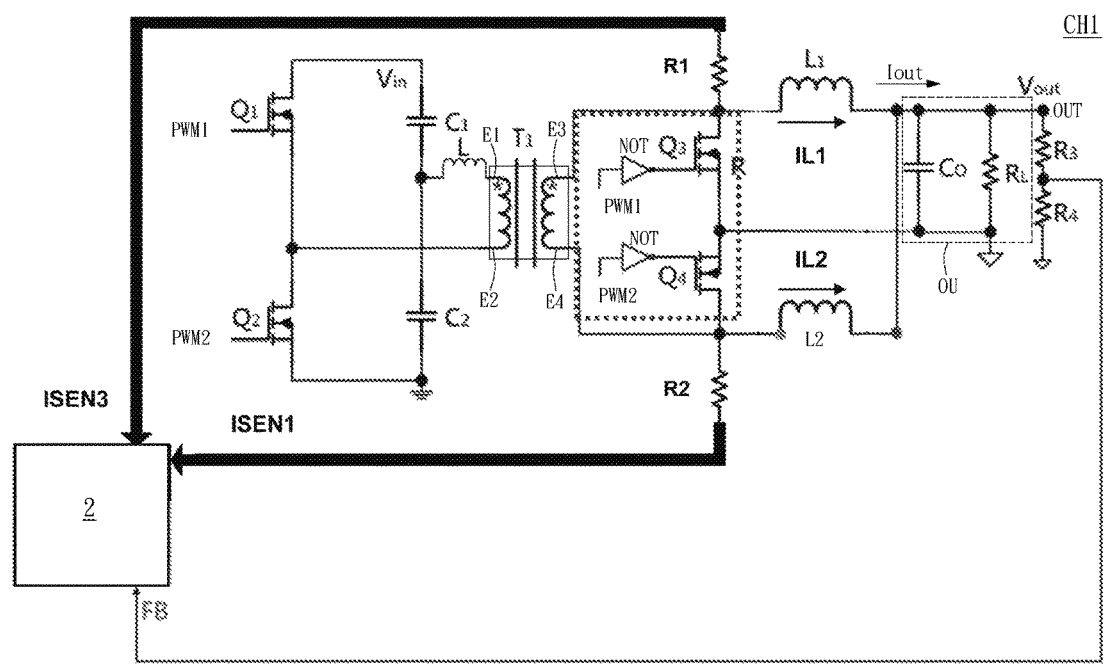
FIG. 3A and FIG. 3B illustrate different embodiments of the first current sensing element in the multi-phase power controller respectively.
Figure 3B:
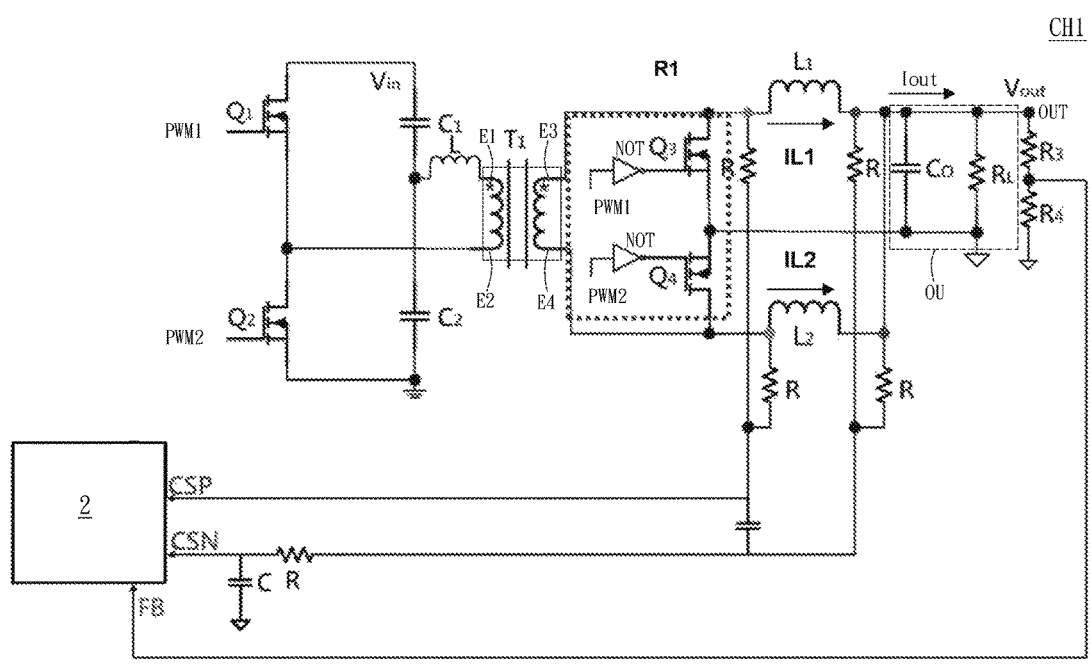

Please refer to FIG. 3A and FIG. 3B. FIG. 3A and FIG. 3B illustrate different embodiments of the first current sensing element in the multi-phase power controller respectively.

As shown in FIG. 3A, the multi-phase power controller 2 is coupled to the first resonant power converting circuit CH1. The first resonant power converting circuit CH1 includes a converting unit T1, a first switch Q1, a second switch Q2, a first capacitor C1, a second capacitor C2, an inductor L, a third switch Q3, a fourth switch Q4, a first inductor L1, a second inductor L2 and an output unit OU. In an embodiment, the converting unit T1 is a transformer, but not limited to this. The converting unit T1 has a first terminal E1, a second terminal E2, a third terminal E3 and a fourth terminal E4. The first terminal E1 and the second terminal E2 are located at a primary side (e.g., a high-voltage side) and the third terminal E3 and the fourth terminal E4 are located at a secondary side (e.g., a low-voltage side). In the primary side (e.g., the high-voltage side) circuit of the first resonant power converting circuit CH1, the first capacitor C1 and the second capacitor C2 are coupled between the input voltage Vin and the ground terminal; the first switch Q1 and the second switch Q2 are coupled between the input voltage Vin and a ground terminal; a terminal of the inductor L is coupled between the first capacitor C1 and the second capacitor C2 and another terminal of the inductor L is coupled to the first terminal E1 of the converting unit T1. In the secondary side (e.g., the low-voltage side) circuit of the first resonant power converting circuit CH1, the first inductor L1 is coupled between the third terminal E3 of the converting unit T1 and the output unit OU and the second inductor L2 is coupled between the fourth terminal E4 of the converting unit T1 and the output unit OU. A first inductor current IL1 flows through the first inductor L1 and a second inductor current IL2 flows through the second inductor L2. The third switch Q3 and the fourth switch Q4 are coupled in series. One terminal of the third switch Q3 is coupled between the third terminal E3 of the converting unit T1 and the first inductor L1 and another terminal of the third switch Q3 is coupled to the ground terminal. One terminal of the fourth switch Q4 is coupled between the fourth terminal E4 of the converting unit T1 and the second inductor L2 and another terminal of the fourth switch Q4 is coupled to the ground terminal.

The multi-phase power controller 2 is coupled to the first switch Q1, the second switch Q2, the third switch Q3 and the fourth switch Q4 respectively. In fact, the multi-phase power controller 2 can provide two PWM signals with different phases to the first resonant power converting circuit CH1. For example, the multi-phase power controller 2 can provide the first pulse width modulation signal PWM1 to gate electrodes of the first switch Q1 and the third switch Q3 to control the operation of the first switch Q1 and the third switch Q3; the multi-phase power controller 2 can provide the second pulse width modulation signal PWM2 to gate electrodes of the second switch Q2 and the fourth switch Q4 to control the operation of the second switch Q2 and the fourth switch Q4. In addition, a NOT gate NOT can generate a complementary signal to a gate electrode of the third switch Q3 according to the first pulse width modulation signal PWM1 provided by the multi-phase power controller 2; the NOT gate NOT can generate a complementary signal to a gate electrode of the fourth switch Q4 according to the second pulse width modulation signal PWM2 provided by the multi-phase power controller 2.

In the timing control of the first resonant power converting circuit CH1 of this embodiment, when the multi-phase power controller 2 controls the first switch Q1 and the fourth switch Q4 to be conducted, the second switch Q2 and the third switch Q3 are turned off; otherwise, when the multi-phase power controller 2 controls the second switch Q2 and the third switch Q3 to be conducted, the first switch Q1 and the fourth switch Q4 are turned off.

In practical applications, the phase difference between the first pulse width modulation signal PWM1 and the second pulse width modulation signal PWM2 can be 180°, but not limited to this.

In the converting unit T1, the first terminal E1 is coupled between the first capacitor C1 and the second capacitor C2 through the inductor L, the second terminal E2 is coupled between the first switch Q1 and the second switch Q2, the third terminal E3 is coupled between the third switch Q3 and the first inductor L1, and the fourth terminal E4 is coupled between the fourth switch Q4 and the second inductor L2.

The output current Tout flows through the output unit OU to generate the output voltage Vout. The output unit OU can include an output capacitor Co and an output resistor $R_L$. The output capacitor Co and the output resistor $R_L$ are connected in parallel between the output voltage Vout and the ground terminal. One terminal of the output capacitor Co is coupled to the first inductor L1 and another terminal of the output capacitor Co is coupled between the third switch Q3 and the fourth switch Q4. One terminal of the output resistance $R_L$, is coupled to the first inductor L1, and another terminal of the output resistance $R_L$, is coupled between the third switch Q3 and the fourth switch Q4.

In addition, the third resistor R3 and the fourth resistor R4 are coupled in series between the output voltage Vout and the ground terminal. The multi-phase power controller 2 is coupled between the third resistor R3 and the fourth resistor R4 and receives a feedback signal FB from between the third resistor R3 and the fourth resistor R4. In this embodiment, the feedback signal FB is a divided voltage signal after the third resistor R3 and the fourth resistor R4 divide the output voltage Vout.

In the embodiment of FIG. 3A, the multi-phase power controller 2 is coupled to the first resonant power converting circuit CH1 through current sensing elements (e.g., the first resistor R1 and the second resistor R2). The first resistor R1 is coupled among the third switch Q3, the third terminal E3 of the converting unit T1 and the first inductor L1. The second resistor R2 is coupled among the fourth switch Q4, the fourth terminal E4 of the converting unit T1 and the second inductors L2. The multi-phase power controller 2 obtains the sensing currents ISEN1 and ISEN3 through the first resistor R1 and the second resistor R2 respectively, to obtain the current levels of the third terminal E3 and the fourth terminal E4 located at the secondary side of the converting unit T1. According to the sensing currents ISEN1 and ISEN3, the duty cycle of the pulse width modulation signal can be controlled respectively, so as to achieve the function of current balance.

Please refer to FIG. 3B. In another embodiment, the multi-phase power controller 2 can be coupled to two terminals of the first inductor L1 and two terminals of the second inductor L2 through current sensing elements (e.g., four resistors R) respectively. The multi-phase power controller 2 can obtain a third current sensing signal CSP and a fourth current sensing signal CSN through the four resistors R used as current sensing elements to obtain a first inductor current IL1 and a second inductor current IL2 flowing through the first inductor L1 and the second inductor L2 respectively to determine whether an over-current phenomenon occurs, so as to timely provide an over-current protection (OCP) function.

Figure 4:
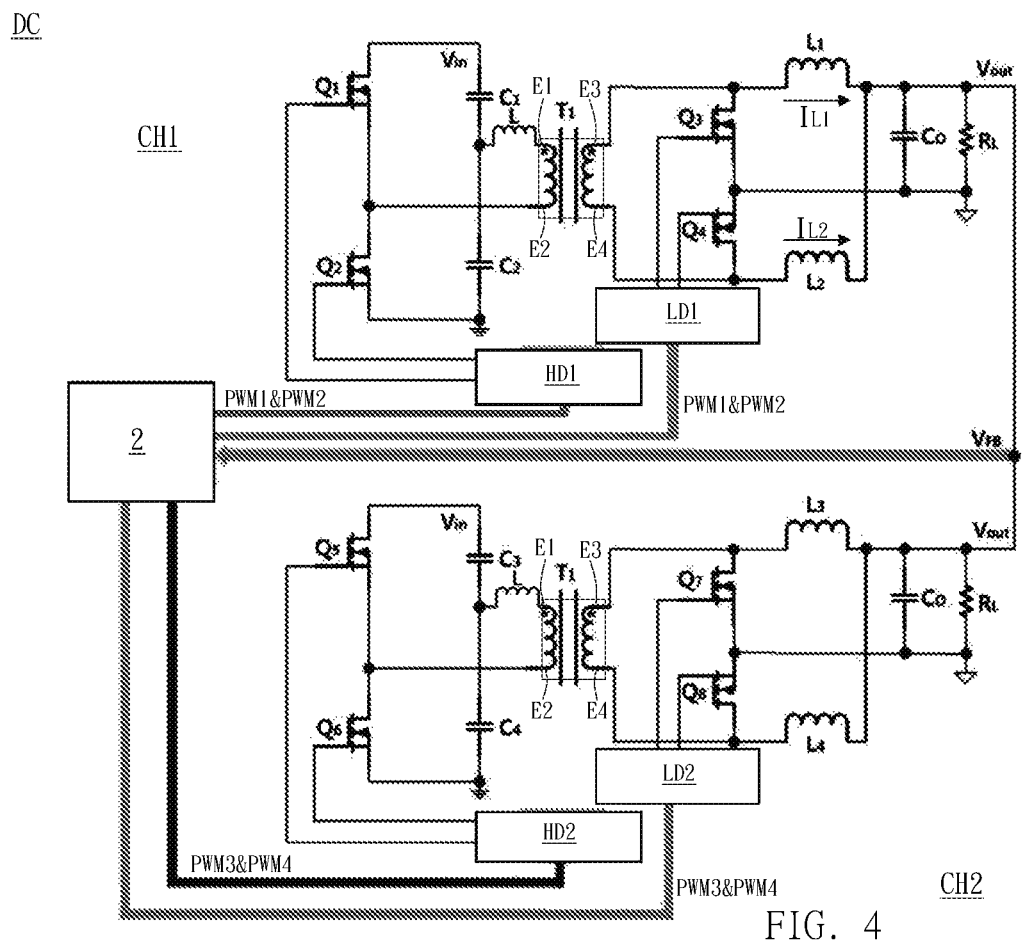
FIG. 4 illustrates a schematic diagram of the DC-DC converting circuit including the multi-phase power controller, the first resonant power converting circuit and the second resonant power converting circuit.

Please refer to FIG. 4. In another embodiment, the DC-DC converting circuit DC includes a multi-phase power controller 2, a first resonant power converting circuit CH1 and a second resonant power converting circuit CH2. The multi-phase power controller 2 is coupled to the first resonant power converting circuit CH1 and the second resonant power converting circuit CH2 respectively. The multi-phase power controller 2 is coupled to gate electrodes of the first switch Q1 and the second switch Q2 at the primary side (e.g., the high-voltage side) of the first resonant power converting circuit CH1 through a first high-voltage driver HD1; the multi-phase power controller 2 is coupled to gate electrodes of the third switch Q3 and the fourth switch Q4 at the secondary side (e.g., the low-voltage side) of the first resonant power converting circuit CH1 through a first low-voltage driver LD1.

The multi-phase power controller 2 can provide the first pulse width modulation signal PWM1 and the second pulse width modulation signal PWM2 to the first high voltage driver HD1, and the first high voltage driver HD1 transmits the first pulse width modulation signal PWM1 and the second pulse width modulation signal PWM2 to gate electrodes of the first switch Q1 and the second switch Q2 respectively to control the operation of the first switch Q1 and the second switch Q2 respectively. The multi-phase power controller 2 can also provide the first pulse width modulation signal PWM1 and the second pulse width modulation signal PWM 2 to the first low-voltage driver LD1, and the first low-voltage driver LD1 transmits the second pulse width modulation signal PWM 2 and the first pulse width modulation signal PWM1 to gate electrodes of the third switch Q3 and the fourth switch Q4 respectively to control the operation of the third switch Q3 and the fourth switch Q4 respectively.

Similarly, the multi-phase power controller 2 is coupled to the gate electrodes of the fifth switch Q5 and the sixth switch Q6 at the high-voltage side (e.g., the primary side) of the second resonant power converting circuit CH2 through a second high-voltage driver HD2; the multi-phase power controller 2 is coupled to the gate electrodes of the seventh switch Q7 and the eighth switch Q8 at the low voltage side (e.g., the secondary side) of the second resonant power converting circuit CH2 through the second low voltage driver LD2.

In practical applications, the multi-phase power controller 2 can be further coupled to a third resonant power converting circuit and a fourth resonant power converting circuit (not shown), or even more resonant power converting circuits, and the above analogies are not repeated here. In addition, the multi-phase power controller 2 provides two pulse width modulation signals to each resonant power converting circuit respectively.

For example, if the multi-phase power controller 2 is coupled to four resonant power converting circuits, the multi-phase power controller 2 can provide eight PWM signals to the four resonant power converting circuits. The phase difference between each PWM signal is 45° (45°=360°/number of PWM signals). In an example of four resonant power converting circuits, the multi-phase power controller 2 provides a first pulse width modulation signal and a fifth pulse width modulation signal to the first resonant power converting circuit, and a phase difference between the first pulse width modulation signal and the fifth pulse width modulation signal is 180°.

It should be noted that although in the primary side circuit architecture of the first resonant power converting circuit CH1 and the second resonant power converting circuit CH2 in the above-mentioned embodiments, the first capacitor C1 and the second capacitor C2 are connected in series between the input voltage Vin and the ground terminal, one terminal of the inductor L is coupled between the first capacitor C1 and the second capacitor C2 and another terminal of the inductor L is coupled to the first terminal E1 of the converting unit T1; however, other different primary circuit configurations can be also used in the resonant power converting circuit of the invention, as long as the resonant effect can be provided by the combination of capacitors and inductors, and this is not limited to the above-mentioned embodiments.

Figure 5A:
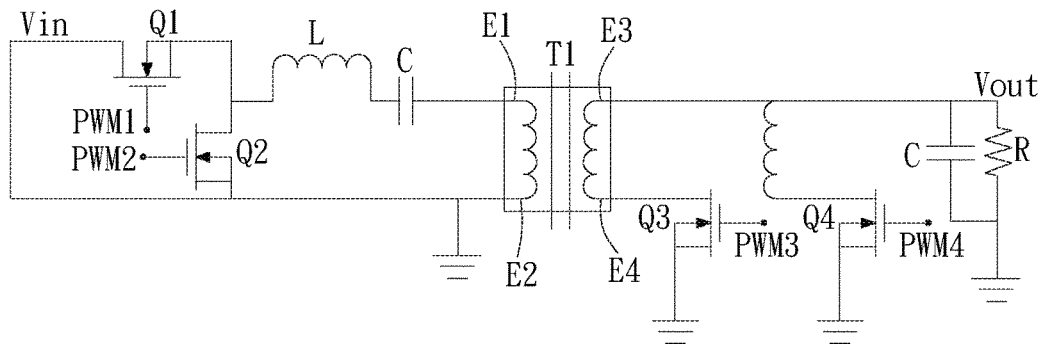
FIG. 5A and FIG. 5B illustrate schematic diagrams of the first resonant power converting circuit having different primary-side circuit structures respectively.

For example, as shown in FIG. 5A, the first resonant power converting circuit CH1 includes a converting unit T1, a first switch Q1, a second switch Q2, an inductor L, a capacitor C, a third switch Q3 and a fourth switch. Q4. The converting unit T1 has a first terminal E1, a second terminal E2, a third terminal E3 and a fourth terminal E4. The first terminal E1 and the second terminal E2 are located at the primary side, and the third terminal E3 and the fourth terminal E4 are located at the secondary side. In the primary side circuit of the first resonant power converting circuit CH1, the first switch Q1 and the second switch Q2 are coupled in series between the input voltage Vin and the ground terminal; the capacitor C and the inductor L are coupled in series with each other; one terminal of the inductor L is coupled between the first switch Q1 and the second switch Q2 and the capacitor C is coupled between another end of the inductor L and the first terminal E1 of the converting unit T1. As for the secondary side circuit of the first resonant power converting circuit CH1, the fourth switch Q4 is coupled between the third terminal E3 of the converting unit T1 and the ground terminal and the third switch Q3 is coupled between the fourth terminal E4 of the converting unit T1 and the ground terminal. The third switch Q3 is controlled by the third pulse width modulation signal PWM3 and the fourth switch Q4 is controlled by the fourth pulse width modulation signal PWM4. The third terminal E3 of the converting unit T1 is coupled to the output voltage Vout. The resistor R and the capacitor C are coupled in parallel between the output voltage Vout and the ground terminal.

Figure 5B:
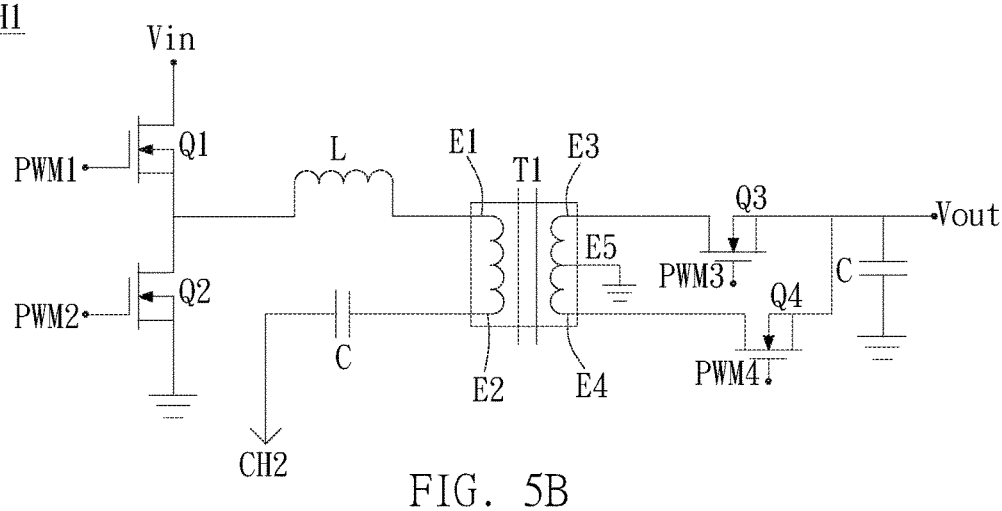

In another embodiment, as shown in FIG. 5B, the first resonant power converting circuit CH1 includes a converting unit T1, a first switch Q1, a second switch Q2, an inductance L, a capacitance C, a third switch Q3 and a fourth switch Q4. The converting unit T1 has a first terminal E1, a second terminal E2, a third terminal E3, a fourth terminal E4 and a fifth terminal E5, wherein the first terminal E1 and the second terminal E2 are located at the primary side; the third terminal E3, the fourth terminal E4 and the fifth terminal E5 are located at the secondary side, and the fifth terminal E5 is coupled to the ground terminal. In the primary side circuit of the first resonant power converting circuit CH1, the first switch Q1 and the second switch Q2 are coupled in series between the input voltage Vin and the ground terminal; one terminal of the inductor L is coupled between the first switch Q1 and the second switch Q2. Another end of the inductor L is coupled to the first terminal E1 of the converting unit T1. One terminal of the capacitor C is coupled to the second terminal E2 of the converting unit T1 and another terminal of the capacitor C is coupled to the second resonant power converting circuit CH2. As to the secondary side circuit of the first resonant power converting circuit CH1, the fifth terminal E5 of the converting unit T1 is located between the third terminal E3 and the fourth terminal E4 and coupled to the ground terminal; the third switch Q3 is coupled between the third terminal E3 of the converting unit T1 and the output voltage Vout and controlled by the third pulse width modulation signal PWM3; the fourth switch Q4 is coupled between the fourth terminal E4 of the converting unit T1 and the output voltage Vout and controlled by the fourth pulse width modulation signal PWM4.

Figure 6:
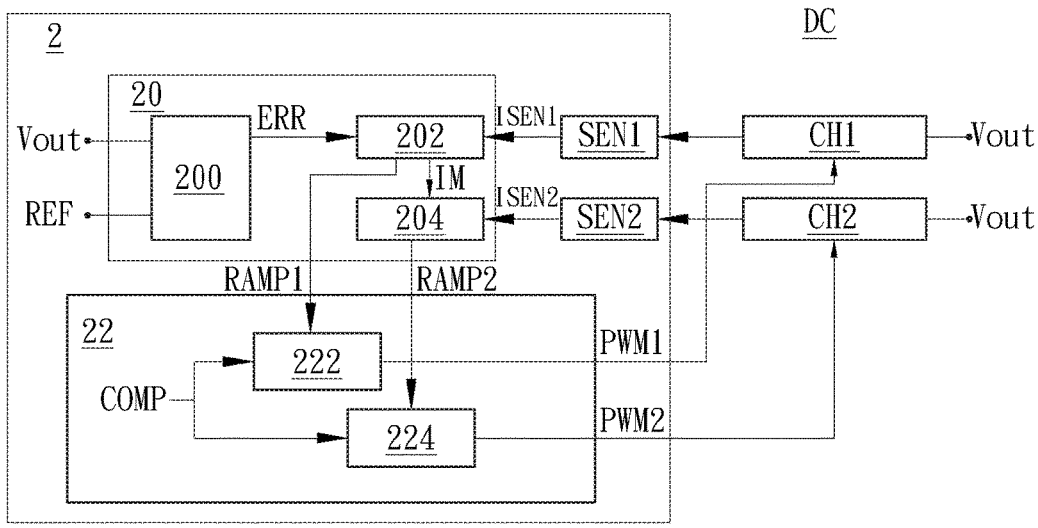
FIG. 6 illustrates a functional block diagram of the multi-phase power controller used for controlling the first resonant power converting circuit and the second resonant power converting circuit in the DC-DC converting circuit.

Please refer to FIG. 6. FIG. 6 illustrates a functional block diagram of the multi-phase power controller 2 used for controlling the first resonant power converting circuit CH1 and the second resonant power converting circuit CH2 in the DC-DC converting circuit DC.

As shown in FIG. 6, the multi-phase power controller 2 is coupled to the first resonant power converting circuit CH1 and the second resonant power converting circuit CH2 to control their operations respectively. The multi-phase power controller 2 includes a frequency adjusting circuit 20, a duty cycle adjusting circuit 22, a first current sensing unit SEN1 and a second current sensing unit SEN2.

The frequency adjusting circuit 20 includes an error amplifier 200, a first ramp signal generation circuit 202 and a second ramp signal generation circuit 204. The error amplifier 200 is coupled to the first ramp signal generation circuit 202. The first ramp signal generation circuit 202 is coupled to the second ramp signal generation circuit 204, the duty cycle adjusting circuit 22 and the first current sensing unit SEN1 respectively. The ramp signal generation circuit 204 is coupled to the first ramp signal generation circuit 202, the duty cycle adjusting circuit 22 and the second current sensing unit SEN1 respectively; the first current sensing unit SEN1 is coupled between the first resonant power converting circuit CH1 and the first ramp signal generation circuit 202; the second current sensing unit SEN2 is coupled between the second resonant power converting circuit CH2 and the second ramp signal generation circuit 204; the duty cycle adjusting circuit 22 is coupled to the first ramp signal generation circuit 202, the second ramp signal generation circuit 204, the first resonant power converting circuit CH1 and the second resonant power converting circuit CH2 respectively.

The error amplifier 200 receives the output voltage Vout (or the feedback signal related to the output voltage Vout) and a reference voltage REF respectively and provides an error signal ERR to the first ramp signal generation circuit 202 according to the output voltage Vout and the reference voltage REF. The first current sensing unit SEN1 senses the first sensing current ISEN1 from the first resonant power converting circuit CH1 and provides it to the first ramp signal generation circuit 202. The second current sensing unit SEN2 senses the second sensing current ISEN2 from the second resonant power converting circuit CH2 and provides it to the second ramp signal generation circuit 204. The first ramp signal generation circuit 202 generates the first ramp signal RAMP1 to the duty cycle adjusting circuit 22 according to the error signal ERR and the first sensing current ISEN1. The first ramp signal generation circuit 202 also outputs the first current IM to the second ramp signal generation circuit 204 according to the error signal ERR. The second ramp signal generation circuit 204 generates the second ramp signal RAMP2 to the duty cycle adjusting circuit 22 according to the first current IM and the second sensing current ISEN2. It should be noted that the first ramp signal generation circuit 202 adjusts the amplitude of the first ramp signal RAMP1 according to the first sensing current ISEN1 and the second ramp signal generation circuit 204 adjusts the amplitude of the second ramp signal RAMP2 according to the second sensing current ISEN2.

The duty cycle adjusting circuit 22 at least includes comparators 222~224. The comparator 222 is coupled to the first ramp signal generation circuit 202 and the first resonant power converting circuit CH1 respectively. The comparator 224 is coupled to the second ramp signal generation circuit 204 and the second resonant power converting circuit CH2 respectively. The comparator 222 receives the first ramp signal RAMP1 and the default voltage COMP respectively and generates the first pulse width modulation signal PWM1 to the first resonant power converting circuit CH1 according to the first ramp signal RAMP1 and the default voltage COMP to control the operation of the first resonant power converting circuit CH1. The comparator 224 receives the second ramp signal RAMP2 and the default voltage COMP respectively and generates the second pulse width modulation signal PWM2 to the second resonant power converting circuit CH2 according to the second ramp signal RAMP2 and the default voltage COMP to control the operation of the second resonant power converting circuit CH2.

It should be noted that, the default voltage COMP is a fixed value, and the amplitude of the first ramp signal RAMP1 has been adjusted with the change of the first sensing current ISEN1 and the amplitude of the second ramp signal RAMP2 has been adjusted with the change of the second sensing current ISEN2; therefore, the first pulse width modulation signal PWM1 generated by the comparator 222 according to the first ramp signal RAMP1 and the default voltage COMP and the second pulse width modulation signal PWM2 generated by the comparator 224 according to the second ramp signal RAMP2 and the default voltage COMP will be adjusted with the change of the first sensing current ISEN1 and the second sensing current ISEN2 respectively.

Please refer to FIG. 7A~FIG. 7C. FIG. 7A and FIG. 7B illustrate schematic diagrams of the frequency adjusting circuit 20 and the duty cycle adjusting circuit 22 in an embodiment and FIG. 7C illustrates a timing diagram of the duty cycle of the first pulse width modulation signal PWM1 adjusted by changing the first ramp signal RAMP1.

As shown in FIG. 7A, the frequency adjusting circuit 20 includes voltage dividing resistors Rf1~Rf2, an error amplifier 200 and a first ramp signal generation circuit 202. The first ramp signal generation circuit 202 includes a first current source VI, a resistor R, a capacitor C and a switch SW. The voltage dividing resistors Rf1 and Rf2 are coupled in series between the output voltage Vout and the ground terminal; a negative input terminal − of the error amplifier 200 is coupled between the voltage dividing resistors Rf1 and Rf2 and a positive input terminal + of the error amplifier 200 is coupled to the reference voltage REF. An output terminal of the error amplifier 200 is coupled to the first current source VI; the resistor R and the capacitor C are coupled in series between the first current source VI and the ground terminal; one terminal of the switch SW is coupled between the resistor R and the capacitor C and another terminal of the switch SW is coupled to the ground terminal.

The error amplifier 200 receives the feedback signal FB and the reference voltage REF through its negative input terminal − and positive input terminal + respectively and provides an error signal ERR to the first current source VI according to the feedback signal FB and the reference voltage REF. Then, the first current source VI outputs the first current IM to the resistor R according to the error signal ERR. In fact, the first current source VI can be a voltage-to-current converter for converting the voltage signal (e.g., the error signal ERR) into the current signal (e.g., the first current IM); that is to say, the first current IM output by the first current source VI is related to the error signal ERR.

It should be noted that the first current sensing unit SEN1 is coupled between the first current source VI and the resistor R in the first ramp signal generation circuit 202 to provide the first sensing current ISEN1 sensed from the first resonant power converting circuit CH1 to the resistance R, so that the first sensing current ISEN1 sensed from the first resonant power converting circuit CH1 can be combined with the first current IM output from the first current source VI to correspondingly adjust the amplitude of the first ramp signal RAMP1 output from the first ramp signal generation circuit 202 to the duty cycle adjusting circuit 22 according to the first sensing current ISEN1.

In addition, the frequency adjusting circuit 20 can include N ramp signal generation circuits corresponding to N resonant power converting circuits, and the first current IM outputted by the first current source VI can be replicated to each ramp signal generation circuit (e.g., in FIG. 7A, the first current IM is replicated to the second ramp signal generation circuit 204) and then superimposed with the sensing current of corresponding resonant power converting circuit (e.g., the second sensing current ISEN2 outputted by the second current sensing unit SEN2 in FIG. 7A) respectively to adjust the amplitudes of N ramp signals corresponding to the N resonant power converting circuits (e.g., the second ramp signal RAMP2 corresponding to the second resonant power converting circuit CH2 in FIG. 7A) respectively and then outputted to the duty cycle adjusting circuit 22.

As shown in FIG. 7B, the duty cycle adjusting circuit 22 includes voltage dividing resistors Rd1~Rd2 and comparators 220~222. The voltage dividing resistors Rd1~Rd2 are coupled in series between the reference voltage VREF and the ground terminal; a positive input terminal + of the comparator 220 is coupled between the voltage dividing resistors Rd1~Rd2 and a negative input terminal − of the comparator 220 is coupled between an output terminal of the comparator 220 and a negative input terminal of the comparator 222; the output terminal of the comparator 220 is coupled to the negative input terminal − of the comparator 222; a positive input terminal + of the comparator 222 receives the first ramp signal RAMP1 from the frequency adjusting circuit 20 and the negative input terminal − of the comparator 222 is coupled to the output terminal and the negative input terminal − of the comparator 220.

The comparator 220 outputs the default voltage COMP to the negative input terminal − of the comparator 222 according to the divided voltage of the reference voltage VREF. The negative input terminal − and the positive input terminal + of the comparator 222 receive the default voltage COMP and the first ramp signal RAMP1 respectively and the comparator 222 outputs the first pulse width modulation signal PWM1 to the first resonant power converting circuit CH1 according to the default voltage COMP and the first ramp signal RAMP1.

It should be noted that since the default voltage COMP in this embodiment is a fixed value, the comparator 222 will compare N ramp signals including the first ramp signal RAMP1 provided by the N ramp signal generation circuits with the default voltage COMP respectively to generate N pulse width modulation signals including the first pulse width modulation signal PWM1 and then output the N pulse width modulation signals to the N resonant power converting circuits including the first resonant power converting circuit CH1 respectively.

As shown in FIG. 7C, since the default voltage COMP is a fixed value, when the amplitude of the first ramp signal RAMP1 changes according to the change of the first sensing current ISEN1, the time point that the first ramp signal RAMP1 intersects with the default voltage COMP will be also changed. Thus, the duty cycle of the first pulse width modulation signal PWM1 will be also affected.

At first, in a time interval ΔT1, since the first sensing current ISEN1 increases, the amplitude of the first ramp signal RAMP1 is raised, the time for the first ramp signal RAMP1 to intersect with the default voltage COMP will become shorter. As a result, the duty cycles D1 and D2 of the first pulse width modulation signal PWM1 will become smaller.

Next, in a time interval ΔT2, since the first sensing current ISEN1 decreases, the amplitude of the first ramp signal RAMP1 is in turn reduced, the time for the first ramp signal RAMP1 to intersect with the default voltage COMP will become longer. As a result, the duty cycles D3 and D4 of the first pulse width modulation signal PWM1 will become larger.

Finally, in a time interval ΔT3, since the first sensing current ISEN1 has reached current balance, both the amplitude of the first ramp signal RAMP1 and the duty cycle D5 and D6 of the first pulse width modulation signal PWM1 will become stable; therefore, it can effectively achieve the linear voltage regulator effect.

Please refer to FIG. 8A~FIG. 8C. FIG. 8A and FIG. 8B illustrate schematic diagrams of the frequency adjusting circuit 20 and the duty cycle adjusting circuit 22 and FIG. 8C illustrates a timing diagram of the duty cycle of the first pulse width modulation signal PWM1 adjusted by changing the default voltage COMP in another embodiment.

As shown in FIG. 8A, the frequency adjusting circuit 20 includes voltage dividing resistors Rf1~Rf2, an error amplifier 200 and a first ramp signal generation circuit 202. The first ramp signal generation circuit 202 includes a first current source VI, a resistor R, a capacitor C and a switch SW. The voltage dividing resistors Rf1~Rf2 are coupled in series between the output voltage Vout and the ground terminal; the negative input terminal − of the error amplifier 200 is coupled between the voltage dividing resistors Rf1~Rf2 and the positive input terminal + of the error amplifier 200 is coupled to the reference voltage REF. The output terminal of the error amplifier 200 is coupled to the first current source VI; the resistor R and the capacitor C are coupled in series between the first current source VI and the ground terminal; one terminal of the switch SW is coupled between the resistor R and the capacitor C and another terminal of the switch SW is coupled to the ground terminal.

The error amplifier 200 receives the feedback signal FB and the reference voltage REF through its negative input terminal − and positive input terminal + respectively and provides the error signal ERR to the first current source VI according to the feedback signal FB and the reference voltage REF. Then, the first current source VI outputs the first current IM to the resistor R according to the error signal ERR. In fact, the first current source VI can be a voltage-to-current converter for converting the voltage signal (e.g., the error signal ERR) into the current signal (e.g., the first current IM). That is to say, the first current IM outputted by the first current source VI is related to the error signal ERR.

It should be noted that the frequency adjusting circuit 20 in this embodiment only includes one ramp signal generation circuit 202 and the ramp signal generation circuit 202 generates the ramp signal RAMP to the duty cycle adjusting circuit 22 according to the first current IM output by the first current source VI.

As shown in FIG. 8B, the duty cycle adjusting circuit 22 includes voltage dividing resistors Rd1~Rd2, a first comparator 220, a resistor RCB, a first sensing current ISEN1 and a second comparator 222. The voltage dividing resistors Rd1~Rd2 are coupled in series between the reference voltage VREF and the ground terminal; the positive input terminal + of the first comparator 220 is coupled between the voltage dividing resistors Rd1 and Rd2 and the negative input terminal − of the first comparator 220 is coupled between the output terminal of the first comparator 220 and the negative input terminal − of the second comparator 222; the output terminal of the first comparator 220 is coupled to the negative input terminal − of the second comparator 222 through the resistor RCB; one terminal of the first sensing current ISEN1 is coupled between the resistor RCB and the negative input terminal − of the second comparator 222 and another terminal of the first sensing current ISEN1 is coupled to the ground terminal; the positive input terminal + of the second comparator 222 receives the ramp signal RAMP from the frequency adjusting circuit 20 and the negative input terminal − of the second comparator 222 is coupled to the resistor RCB.

The first comparator 220 outputs the default voltage COMP to the negative input terminal − of the second comparator 222 according to the divided voltage of the reference voltage VREF. The negative input terminal − of the second comparator 222 receives the default voltage COMP affected by the resistance RCB and the first sensing current ISEN1 and the positive input terminal + of the second comparator 222 receives the ramp signal RAMP. The second comparator 222 outputs the first pulse width modulation signal PWM1 to the first resonant power converting circuit CH1 according to the default voltage COMP and the ramp signal RAMP.

It should be noted that the duty cycle adjusting circuit 22 can include N second comparators corresponding to N resonant power converting circuits to adjust the default voltage COMP according to N sensing currents of the N resonant power converting circuits respectively and then output the adjusted default voltage COMP to the N second comparators. Then, the N second comparators output N pulse width modulation signals to the N resonant power converting circuits respectively to control the operations of the N resonant power converting circuits respectively.

As shown in FIG. 8C, since the amplitude of the ramp signal RAMP is maintained constant, when the default voltage COMP changes according to the change of the first sensing current ISEN1, the time point that the ramp signal RAMP intersects with the default voltage COMP will be also changed. As a result, the duty cycle of the first pulse width modulation signal PWM1 will be also affected.

At first, in a time interval ΔT1, since the first sensing current ISEN1 increases, the default voltage COMP will be reduced, the time for the ramp signal RAMP to intersect with the default voltage COMP will become shorter. As a result, the duty cycles D1 and D2 of the first pulse width modulation signal PWM1 will become smaller.

Then, in a time interval ΔT2, since the first sensing current ISEN1 decreases, the default voltage COMP will be raised, the time for the ramp signal RAMP to intersect with the default voltage COMP will become longer. As a result, the duty cycles D3 and D4 of the first pulse width modulation signal PWM1 will become larger.

Finally, in a time interval ΔT3, since the first sensing current ISEN1 has reached current balance, both the amplitude of the ramp signal RAMP and the duty cycle D5 and D6 of the first pulse width modulation signal PWM1 will become stable; therefore, it can effectively achieve the linear voltage regulator effect.

Compared to the prior arts, the DC-DC converting circuit disclosed in the invention can control the resonant power converting circuits to convert the input voltage into the output voltage through its multi-phase power controller, not only the duty cycle of the PWM signal can be adjusted according to the current feedback signal sensed from the resonant power converting circuits to fine-tune the output voltage to achieve current balance, but also the switching frequency can be adjusted according to the output voltage feedback signal from the resonant power converting circuits to rough-tune the output voltage to achieve the linear voltage regulation effect. Therefore, the multi-phase power controller disclosed in the invention can not only reduce the switching loss of the primary side switches of the resonant power converting circuits, but also improve the overall performance of the system by the current balance mechanism.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A multi-phase power controller, coupled to a plurality of resonant power converting circuits providing an output voltage, the multi-phase power controller comprising:
    a first current sensing unit, coupled to a first resonant power converting circuit of the resonant power converting circuits, for providing a first sensing current;
    a frequency adjusting circuit, comprising:
        an error amplifier, for providing an error signal according to the output voltage and a reference voltage; and
        a first ramp signal generation circuit, coupled to the error amplifier, for providing a first ramp signal according to the error signal; and
    a duty cycle adjusting circuit, coupled to the frequency adjusting circuit, for providing a first pulse-width modulation signal to the first resonant power converting circuit according to a default voltage and the first ramp signal,
    wherein a duty cycle change of the first pulse-width modulation signal is related to the first sensing current, the default voltage and the first ramp signal.

2. The multi-phase power controller of claim 1, wherein the first ramp signal generation circuit comprises a first current source providing a first current related to the error signal.

3. The multi-phase power controller of claim 2, wherein the first sensing current and the first current are combined to adjust an amplitude of the first ramp signal.

4. The multi-phase power controller of claim 3, wherein the duty cycle adjusting circuit comprises a comparator, a first terminal of the comparator receives the default voltage and a second terminal of the comparator receives the first ramp signal.

5. The multi-phase power controller of claim 1, wherein the duty cycle adjusting circuit comprises a comparator, a first terminal of the comparator receives the default voltage through a first resistor and the first terminal of the comparator also receives the first sensing current and a second terminal of the comparator receives the first ramp signal.

6. The multi-phase power controller of claim 2, further comprising:
    a second current sensing unit, coupled to a second resonant power converting circuit of the resonant power converting circuits, for providing a second sensing current; and
    a second ramp signal generation circuit, coupled to the error amplifier, for providing a second ramp signal according to the error signal;
    wherein the duty cycle adjusting circuit provides a second pulse-width modulation signal to the second resonant power converting circuit according to the default voltage and the second ramp signal, the second ramp signal generation circuit receives the first current and the first current and the second sensing current are combined to adjust an amplitude of the second ramp signal.

7. The multi-phase power controller of claim 1, further comprising:
    a second current sensing unit, coupled to a second resonant power converting circuit of the resonant power converting circuits, for providing a second sensing current;
    wherein the duty cycle adjusting circuit comprises a comparator, a first terminal of the comparator receives the default voltage through a first resistor and the first terminal of the comparator also receives the second sensing current and a second terminal of the comparator receives the first ramp signal.

8. The multi-phase power controller of claim 1, wherein the first resonant power converting circuit comprises:
    a converting unit having a first terminal, a second terminal, a third terminal and a fourth terminal, wherein the first terminal and the second terminal are located at a primary side and the third terminal and the fourth terminal are located at a secondary side;
    a first switch;
    a second switch, coupled in series with the first switch between an input voltage and a ground terminal;
    an input inductor having a terminal coupled between the first switch and the second switch;
    an input capacitor, coupled in series with the input inductor between another terminal of the input inductor and the first terminal of the converting unit;
    a third switch; and
    a fourth switch, wherein the third switch and the fourth switch are coupled between the third terminal of the converting unit and the ground terminal and between the fourth terminal of the converting unit and the ground terminal respectively.

9. The multi-phase power controller of claim 1, wherein the first resonant power converting circuit comprises:
    a converting unit having a first terminal, a second terminal, a third terminal and a fourth terminal, wherein the first terminal and the second terminal are located at a primary side and the third terminal and the fourth terminal are located at a secondary side;
    a first switch;
    a second switch, coupled in series with the first switch between an input voltage and a ground terminal, wherein the second terminal of the converting unit is coupled between the first switch and the second switch;
    a first input capacitor;
    a second input capacitor, coupled in series with the first input capacitor between the input voltage and the ground terminal;

an input inductor having a terminal coupled between the first input capacitor and the second input capacitor and another terminal coupled to the first terminal of the converting unit;

a third switch; and a fourth switch, wherein the third switch and the fourth switch are coupled between the third terminal of the converting unit and the ground terminal and between the fourth terminal of the converting unit and the ground terminal respectively.

10. The multi-phase power controller of claim 1, wherein the first resonant power converting circuit comprises:

a converting unit having a first terminal, a second terminal, a third terminal, a fourth terminal and a fifth terminal, wherein the first terminal and the second terminal are located at a primary side and the third terminal, the fourth terminal and the fifth terminal are located at a secondary side, the fifth terminal is coupled to a ground terminal;

a first switch;

a second switch, coupled in series with the first switch between an input voltage and the ground terminal;

an input inductor having a terminal coupled between the first switch and the second switch and another terminal coupled to the first terminal of the converting unit;

an input capacitor having a terminal coupled to the second terminal of the converting unit and another terminal coupled to a second resonant power converting circuit of the resonant power converting circuits;

a third switch, coupled between the third terminal of the converting unit and the output voltage; and a fourth switch, coupled between the fourth terminal of the converting unit and the output voltage.

11. A DC-DC converting circuit, comprising:

a plurality of resonant power converting circuits for providing an output voltage, wherein each resonant power converting circuit comprises an input inductor and a converting unit, the input inductor is coupled to a primary side of the converting unit; and a multi-phase power controller, coupled to the resonant power converting circuits, for obtaining a first sensing current from a first resonant power converting circuit of the resonant power converting circuits, wherein the multi-phase power controller generates an error signal according to the output voltage and a reference voltage and then generates a first ramp signal according to the error signal, and the multi-phase power controller adjusts a duty cycle of a first pulse-width modulation signal outputted to the first resonant power converting circuit by the multi-phase power controller according to a default voltage, the first sensing current and the first ramp signal.

12. The DC-DC converting circuit of claim 11, wherein the multi-phase power controller comprises:

a first current sensing unit, coupled to the first resonant power converting circuit, for obtaining the first sensing current from the first resonant power converting circuit;

a frequency adjusting circuit, comprising:

an error amplifier, for providing the error signal according to the output voltage and the reference voltage; and a first ramp signal generation circuit, coupled to the error amplifier, for providing the first ramp signal according to the error signal; and a duty cycle adjusting circuit, coupled to the frequency adjusting circuit, for providing the first pulse-width modulation signal to the first resonant power converting circuit according to the default voltage and the first ramp signal.

13. The DC-DC converting circuit of claim 12, wherein the first ramp signal generation circuit comprises a first current source providing a first current related to the error signal, the first sensing current and the first current are combined to adjust an amplitude of the first ramp signal.

14. The DC-DC converting circuit of claim 12, wherein the duty cycle adjusting circuit comprises a comparator, a first terminal of the comparator receives the default voltage and a second terminal of the comparator receives the first ramp signal.

15. The DC-DC converting circuit of claim 12, wherein the duty cycle adjusting circuit comprises a comparator, a first terminal of the comparator receives the default voltage through a first resistor and the first terminal of the comparator also receives the first sensing current and a second terminal of the comparator receives the first ramp signal.

16. The DC-DC converting circuit of claim 13, wherein the multi-phase power controller further comprises:

a second current sensing unit, coupled to a second resonant power converting circuit of the resonant power converting circuits, for providing a second sensing current; and a second ramp signal generation circuit, coupled to the error amplifier, for providing a second ramp signal according to the error signal;

wherein the duty cycle adjusting circuit provides a second pulse-width modulation signal to the second resonant power converting circuit according to the default voltage and the second ramp signal, the second ramp signal generation circuit receives the error signal and the error signal and the second sensing current are combined to adjust an amplitude of the second ramp signal.

17. The DC-DC converting circuit of claim 12, wherein the multi-phase power controller further comprises:

a second current sensing unit, coupled to a second resonant power converting circuit of the resonant power converting circuits, for providing a second sensing current;

wherein the duty cycle adjusting circuit comprises a comparator, a first terminal of the comparator receives the default voltage through a first resistor and the first terminal of the comparator also receives the second sensing current and a second terminal of the comparator receives the first ramp signal.

18. The DC-DC converting circuit of claim 11, wherein the first resonant power converting circuit comprises:

a converting unit having a first terminal, a second terminal, a third terminal and a fourth terminal, wherein the first terminal and the second terminal are located at a primary side and the third terminal and the fourth terminal are located at a secondary side;

a first switch;

a second switch, coupled in series with the first switch between an input voltage and a ground terminal;

an input inductor having a terminal coupled between the first switch and the second switch;

an input capacitor, coupled in series with the input inductor between another terminal of the input inductor and the first terminal of the converting unit;

a third switch; and a fourth switch, wherein the third switch and the fourth switch are coupled between the third terminal of the converting unit and the ground terminal and between the fourth terminal of the converting unit and the ground terminal respectively.

19. The DC-DC converting circuit of claim 11, wherein the first resonant power converting circuit comprises:
- a converting unit having a first terminal, a second terminal, a third terminal and a fourth terminal, wherein the first terminal and the second terminal are located at a primary side and the third terminal and the fourth terminal are located at a secondary side;
- a first switch;
- a second switch, coupled in series with the first switch between an input voltage and a ground terminal, wherein the second terminal of the converting unit is coupled between the first switch and the second switch;
- a first input capacitor;
- a second input capacitor, coupled in series with the first input capacitor between the input voltage and the ground terminal;
- an input inductor having a terminal coupled between the first input capacitor and the second input capacitor and another terminal coupled to the first terminal of the converting unit;
- a third switch; and
- a fourth switch, wherein the third switch and the fourth switch are coupled between the third terminal of the converting unit and the ground terminal and between the fourth terminal of the converting unit and the ground terminal respectively.

20. The DC-DC converting circuit of claim 11, wherein the first resonant power converting circuit comprises:
- a converting unit having a first terminal, a second terminal, a third terminal, a fourth terminal and a fifth terminal, wherein the first terminal and the second terminal are located at a primary side and the third terminal, the fourth terminal and the fifth terminal are located at a secondary side, the fifth terminal is coupled to a ground terminal;
- a first switch;
- a second switch, coupled in series with the first switch between an input voltage and the ground terminal;
- an input inductor having a terminal coupled between the first switch and the second switch and another terminal coupled to the first terminal of the converting unit;
- an input capacitor having a terminal coupled to the second terminal of the converting unit and another terminal coupled to a second resonant power converting circuit of the resonant power converting circuits;
- a third switch, coupled between the third terminal of the converting unit and the output voltage; and
- a fourth switch, coupled between the fourth terminal of the converting unit and the output voltage.

* * * * *